United States Patent
Hunter et al.

(10) Patent No.: US 10,383,240 B2
(45) Date of Patent: Aug. 13, 2019

(54) HOUSING TO RETAIN INTEGRATED CIRCUIT PACKAGE

(71) Applicant: Honeywell International Inc., Morris Plains, NJ (US)

(72) Inventors: J. L. Hunter, Lanark, IL (US); Anthony J. Bussan, Davis Junction, IL (US)

(73) Assignee: Honeywell International Inc., Morris Plains, NJ (US)

( * ) Notice: Subject to any disclaimer, the term of this patent is extended or adjusted under 35 U.S.C. 154(b) by 46 days.

(21) Appl. No.: 15/621,545

(22) Filed: Jun. 13, 2017

(65) Prior Publication Data

US 2018/0359871 A1    Dec. 13, 2018

(51) Int. Cl.
*H05K 7/00*      (2006.01)
*H05K 5/02*      (2006.01)
*G01R 33/09*     (2006.01)

(52) U.S. Cl.
CPC ......... *H05K 5/0217* (2013.01); *G01R 33/091* (2013.01); *G01R 33/096* (2013.01)

(58) Field of Classification Search
CPC ... H05K 5/0217; G01R 33/091; G01R 33/096
USPC ........................................................ 361/820
See application file for complete search history.

(56) References Cited

U.S. PATENT DOCUMENTS

| | | | | |
|---|---|---|---|---|
| 5,250,925 A | * | 10/1993 | Shinkle | H01L 43/02 174/551 |
| 5,581,179 A | * | 12/1996 | Engel | G01D 5/147 174/556 |
| 5,912,556 A | * | 6/1999 | Frazee | G01D 11/245 324/207.2 |
| 6,335,548 B1 | | 1/2002 | Roberts et al. | |
| D515,520 S | | 2/2006 | Komoto | |
| 7,242,180 B1 | * | 7/2007 | O'Connor | G01P 1/026 324/207.2 |
| 7,567,602 B2 | * | 7/2009 | Tsuji | G11B 7/127 372/34 |
| D761,745 S | | 7/2016 | Shinkai | |
| 2013/0278246 A1 | * | 10/2013 | Stegerer | G01R 33/09 324/207.12 |
| 2016/0041235 A1 | * | 2/2016 | Ausserlechner | G01R 33/02 324/244 |

* cited by examiner

*Primary Examiner* — Hung S. Bui
(74) *Attorney, Agent, or Firm* — Seager, Tufte & Wickhem LLP (57) ABSTRACT

Embodiments relate generally to systems and methods for retaining a sensor package within a carrier. A sensor package assembly may comprise a sensor package comprising at least one sensor element located within a sensing face of the sensor package; and a carrier comprising retention features configured to retain the sensor package while completely exposing the sensing face of the sensor package. A method for retaining a sensor package within a carrier may comprise inserting a sensor package into a carrier, wherein inserting the sensor package displaces one or more retaining clips of the carrier; retaining the sensor package within the carrier via the retaining clips interfacing with one or more notches of the sensor package; and exposing a sensing face of the sensor package via an opening in the carrier, wherein the sensor package comprises one or more sensor elements located in the sensing face of the sensor package.

17 Claims, 5 Drawing Sheets

HOUSING TO RETAIN INTEGRATED CIRCUIT PACKAGE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The dependence of the electrical resistance of a body on an external magnetic field is called magnetoresistance. Magnetoresistance sensors are used to detect magnetoresistance, and have been widely applied in various electronic products and circuits. Generally, magnetoresistance sensors are based on the mechanisms including anisotropic magnetoresistance (AMR), giant magnetoresistance (GMR), tunneling magnetoresistance (TMR), or combination thereof. Currently, magnetoresistance sensors can be integrated into integrated circuits (IC) to achieve the object of miniaturization and highly integration.

SUMMARY

In an embodiment, a sensor package assembly may comprise a sensor package comprising at least one sensor element located within a sensing face of the sensor package; and a carrier comprising retention features configured to retain the sensor package while completely exposing the sensing face of the sensor package.

In an embodiment, a method for retaining a sensor package within a carrier may comprise inserting a sensor package into a carrier, wherein inserting the sensor package displaces one or more retaining clips of the carrier; retaining the sensor package within the carrier via the retaining clips interfacing with one or more notches of the sensor package; and exposing a sensing face of the sensor package via an opening in the carrier, wherein the sensor package comprises one or more sensor elements located in the sensing face of the sensor package.

In an embodiment, a carrier configured to retain a sensor package may comprise a plurality of walls forming a first opening configured expose a sensing face of the sensor package, wherein the sensor package comprise at least one sensor element located near the sensing face; and one or more retaining clips configured to interface with a housing of the sensor package.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Embodiments of the disclosure include systems and methods for improving the access and stability of an integrated circuit (IC) package comprising a magnetic sensor, which may also be called a sensor package. The IC package may be used in a speed and/or direction sensor. The IC package may be mechanically installed, directly into a carrier assembly, with retention features on both the IC package and the carrier. The retention features may allow full access to the sensing face of the IC package.

The disclosed embodiments may comprise simplified intermediate packaging, thereby reducing the overall system cost. Additionally, the simplicity of the assembly may allow for positioning of the sensor of the IC package closer to the target being sensed than achieved by typical sensor packages. The distance between the sensor and the target may be called an "airgap." The reduction in the airgap may be accomplished by eliminating the need for retaining components over the sensor sensing face.

The IC package may comprise pockets and/or notches to allow the use of retention clips within the carrier assembly. The notches may be positioned so that the carrier may retain the IC package while allowing full access to the sensing face of the IC package. The simplicity of the connection between the carrier assembly and the IC package may also reduce errors in assembly.

Figure 1:
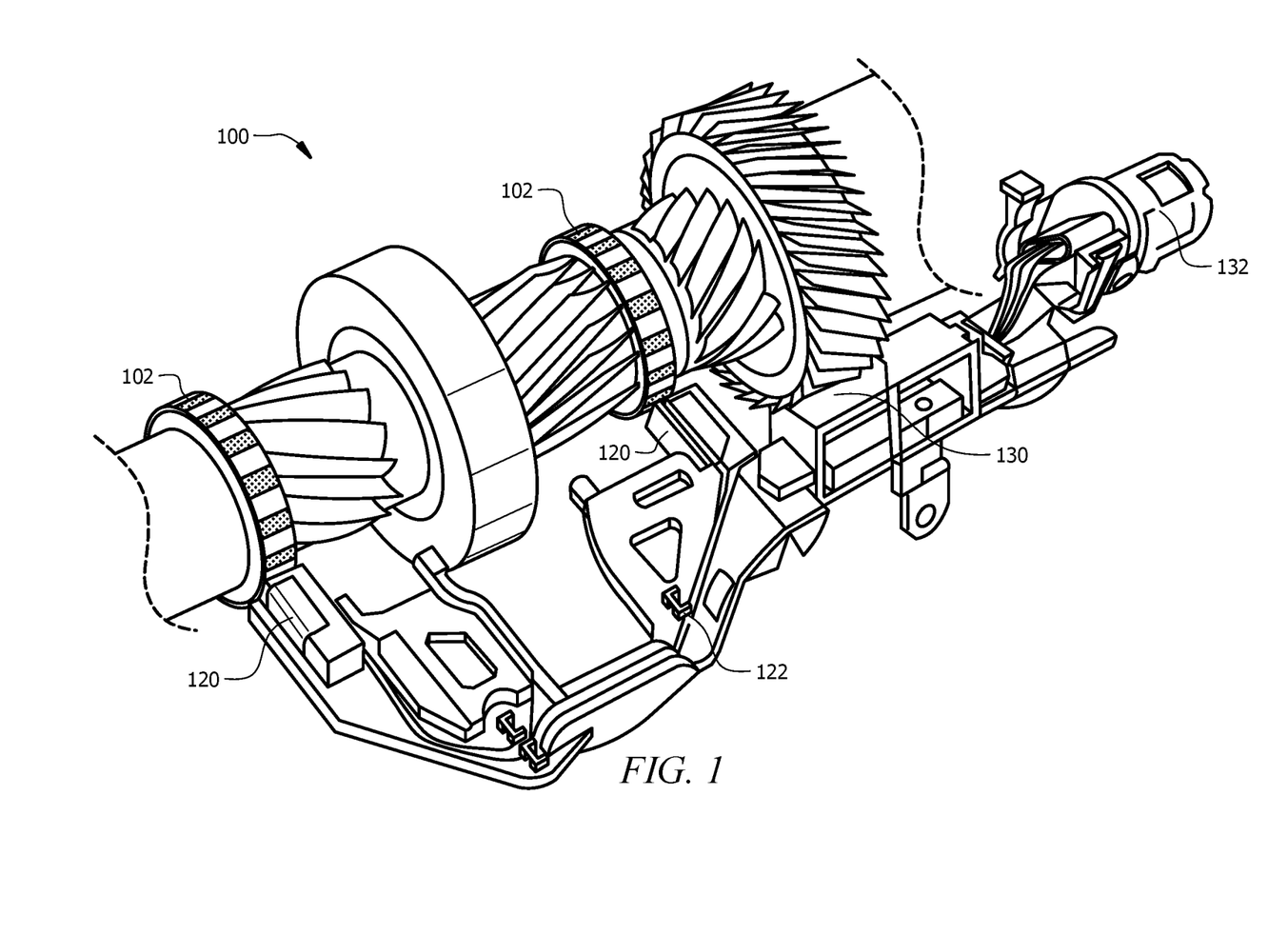
FIG. 1 illustrates a transmission system comprising one or more speed sensors.

Referring now to FIG. 1, an exemplary embodiment of a transmission system 100 is shown, where the transmission system 100 employs Anisotropic Magnetoresistance (AMR) speed sensors 120 to monitor the speed of input shafts of the transmission. The speed sensors 120 monitor the encoder discs 102 comprising the AMR magnets, where the discs 102 are attached to rotating elements of the transmission system 100. The speed sensors 120 may communicate with a sensor module 122, as well as other sensor elements such as a drive position sensor 130 and a connector sensor module and wiring 132.

Figure 2A:
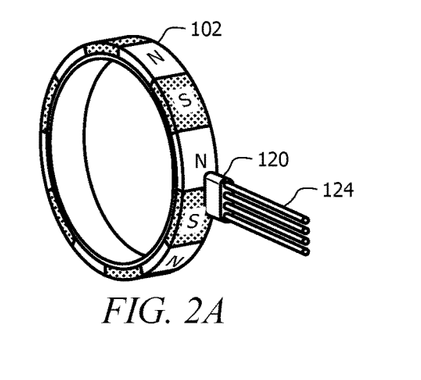
FIGS. 2A-2C illustrate an AMR magnet and sensor package.
Figure 2B:
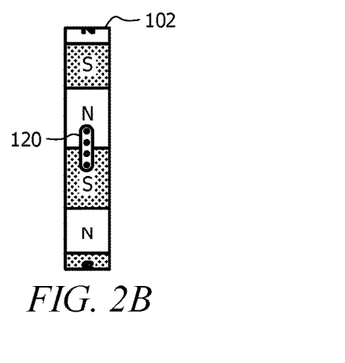
Figure 2C:
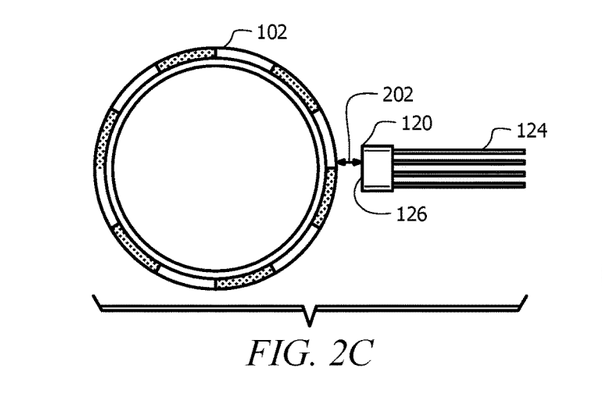

Referring to FIGS. 2A-2C detailed views of an AMR speed sensor are shown, wherein the magnet ring 102 comprises a first shape and orientation. The sensor package 120 (of the speed sensor) may be located in proximity to the magnet ring 102, and the space between the sensor package 120 and the magnet ring 102 may be called an airgap 202. The sensor package 120 may comprise one or more leads 124 configured to communicate information to and from the sensor package 120.

Figure 3A:
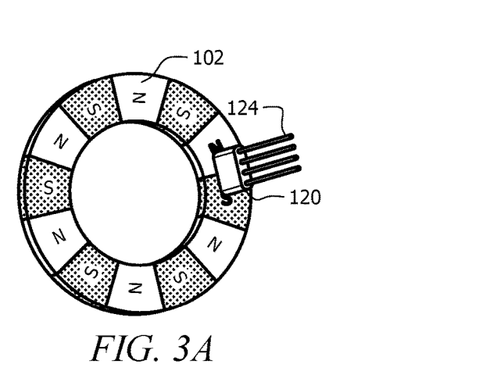
FIGS. 3A-3C illustrate an AMR magnet and sensor package.
Figure 3B:
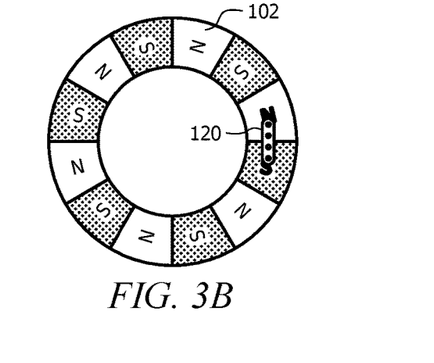
Figure 3C:
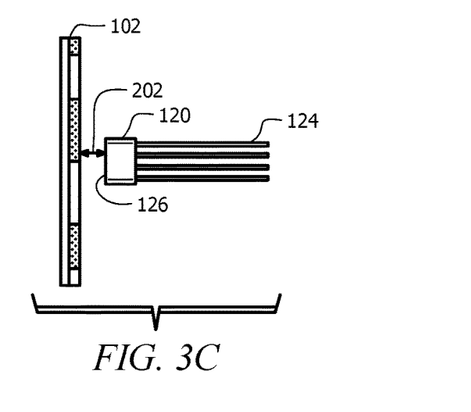

Referring to FIGS. 3A-3C detailed views of an AMR speed sensor are shown, wherein the magnet ring 102 comprises a second shape and orientation. The sensor package 120 (of the speed sensor) may be located in proximity to the magnet ring 102, and the space between the sensor package 120 and the ring 102 may be called an airgap 202. The sensor package 120 may comprise one or more leads 124 configured to communicate information to and from the sensor package 120.

Referring to FIGS. 2A-2C and FIGS. 3A-3C, there are multiple ways to employ sectioned magnet rings 102 with a speed sensor 120. In some embodiments, a plurality of sensors 120 may be used, while in other embodiments, a single sensor 120 may be used. In the examples shown in FIGS. 2A-2C and 3A-3C, a multi-section magnet ring 102 may provide a repeating pattern of north and south magnet poles, and one or more sensors 120 may be located in proximity to the magnet ring 102. In some embodiments, one or more sensor elements may be located within the sensor package 120. The sensor package 120 may comprise a "sensing face" 126, where the one or more sensor elements may be located at or near the sensing face 126, so as to decrease the total distance between the sensor elements and the magnet ring 102. The one or more sensors 120 may not cover the whole rotation of the shaft, but concentrate on one location. This may allow for grouping of the sensors or sensor elements. For example, one or more sensors may be grouped within the sensor package 120 for practical packaging reasons and to provide magnetic shielding from motor field coils in close proximity to the sensor package 120. In some embodiments, the sensor 120 may be combined with other sensing elements, such as addition sensor packages, and/or a Hall Effect sensor.

The use of AMR sensors, such as the sensor packages 120 shown in FIGS. 2A-2C and 3A-2C, provides a contactless method of achieving angular or linear position sensing. Unlike Hall Effect Devices that require kilo-gauss level magnetic fields from rare earth magnets, the sensors provide a higher resolution sensor with much less field strength. The dominant limiting factor on resolution is typically the analog to digital converter bit size over the Boltzmann noise of the resistive elements. Linear sensing ranges of the sensors can be easily extended by using multiple sensors and component counts can be minimized by multiplexing sensor output signals to one or more analog to digital converter ICs. Multiplexing can also be utilized to reduce sensor power consumption in energy limited applications. The sensors may comprise plastic encapsulated silicon sensor die, which are inherently insensitive to mechanical shock and vibration.

Figure 4:
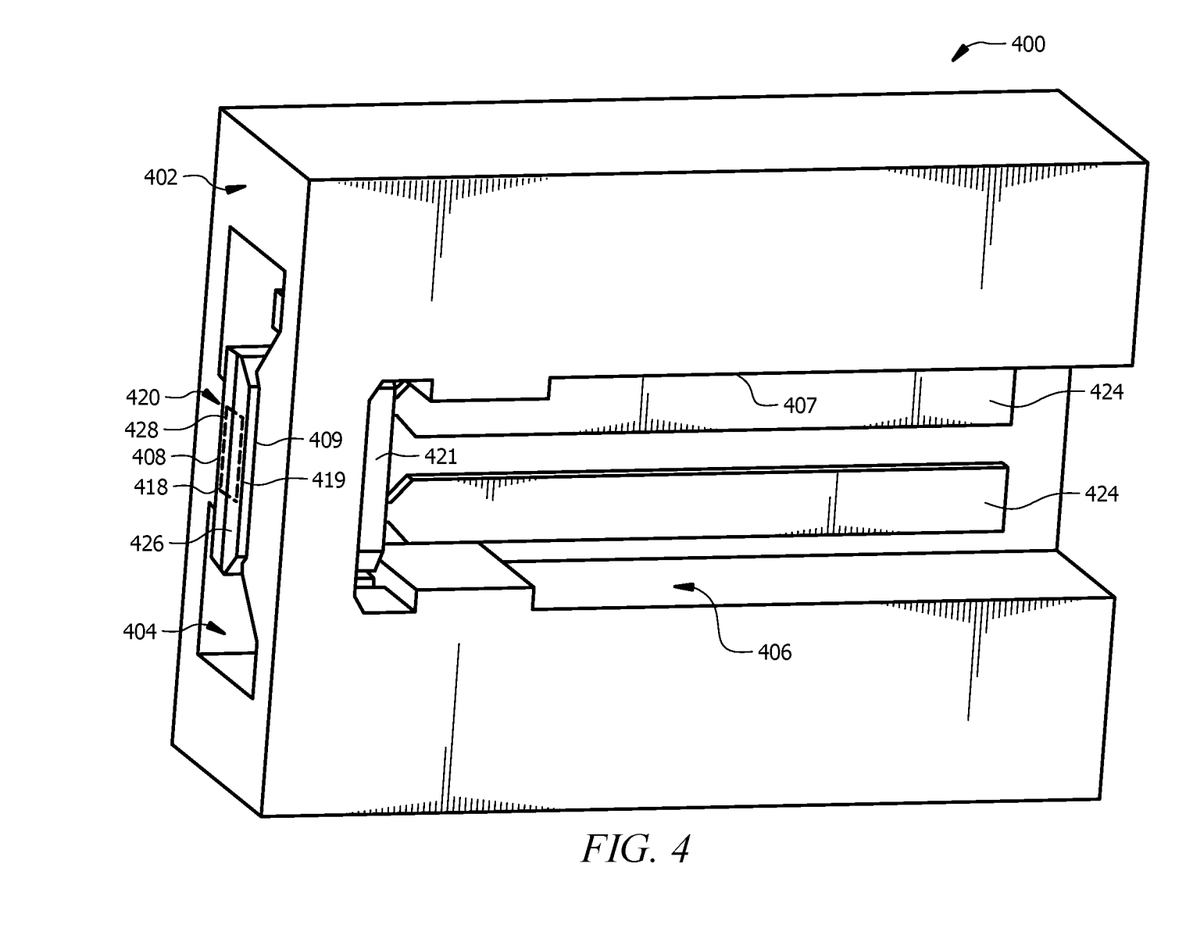
FIG. 4 illustrates a detailed view of a sensor package and carrier assembly.

Referring to FIG. 4, a detailed view of an exemplary sensor package assembly 400, comprising a sensor package 420 assembled within a carrier 402, is shown. The sensor package 420 may be similar to the sensor (or sensor package) 120 described above, and may comprise a housing 421, leads 424, and at least one sensor element 428 located within the housing 421. The sensor element 428 may be located at or near a "sensing face" 426 of the sensor package 420. When the sensor package 420 is assembled within the carrier 402, the sensing face 426 may be completely exposed and not covered by the carrier 402.

The carrier 402 may comprise a first opening 404 configured to fit around the housing 421 of the sensor package 420, wherein the first opening 404 may expose the sensing face 426 of the sensor package 420. The opening 404 may be at least partially formed by a first retaining wall 408 and a second retaining wall 409, where the retaining walls 408 and 409 may be shaped to fit around the housing 421 of the sensor package 420. In some embodiments, the retaining walls 408 and 409 may comprise different shapes or features that align with shapes or features of the housing 421. For example, the first retaining wall 408 may be shaped to align with a first surface 418 of the housing 421, while the second retaining wall 409 may be shaped to align with a second surface 419 of the housing 421. The shapes and/or features of the retaining walls 408 and 409 may ensure that the housing 421 is installed correcting within the carrier 402. The carrier 402 may comprise walls 406 and 407 allowing access to the one or more leads 424 extending from the sensor package 420.

Figure 5:
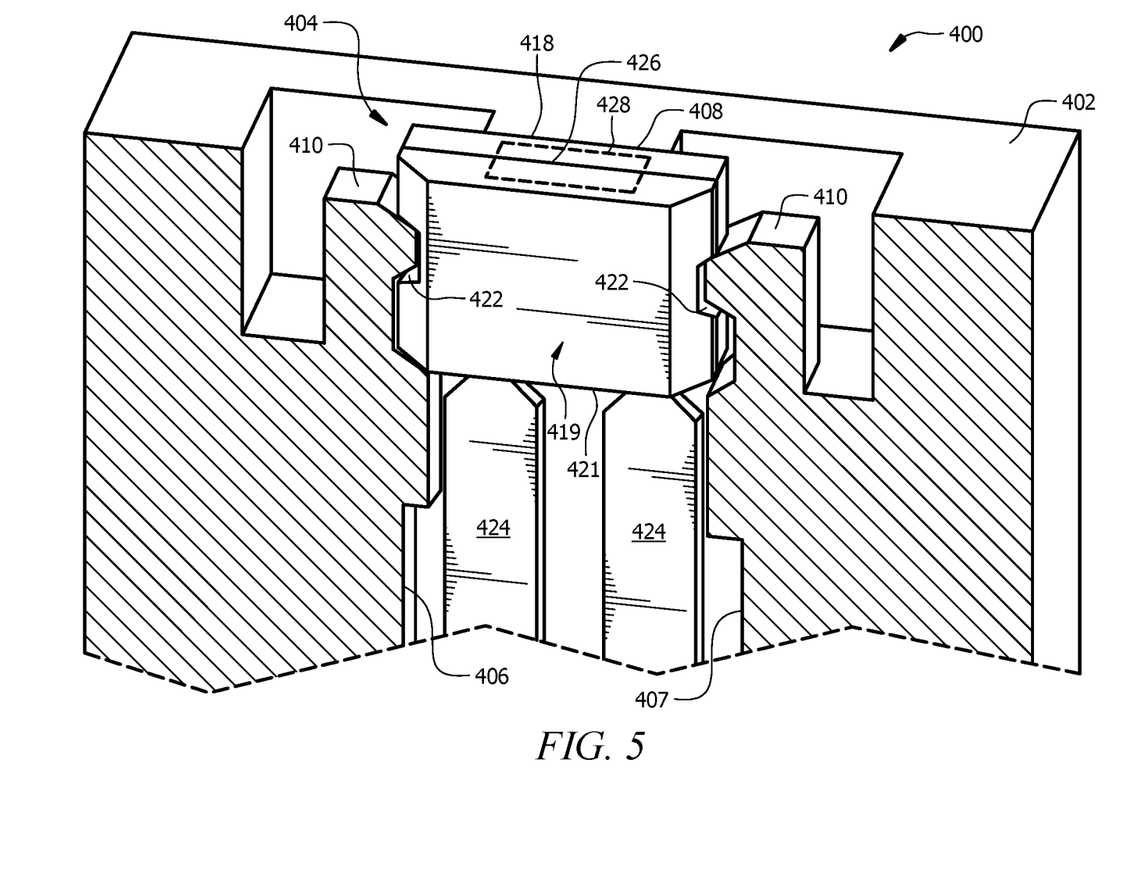
FIG. 5 illustrates a cross-sectional view of the sensor package and carrier assembly.

Referring to FIG. 5, a cross-sectional view of the sensor package assembly 400 is shown (wherein only the carrier 402 is shown in cross-section). The carrier 402 may comprise retention clips 410 located within the opening 404. The housing 421 of the sensor package 420 may comprise notches 422 configured to interface with the retention clips 410 to hold the sensor package 420 in place within the carrier 402. In some embodiments, the retention clips 410 may be configured to deform and/or bend while the housing 421 is inserted into the carrier, and then configured to snap into place within the notches 422 once the housing 421 has been inserted correctly within the carrier 402. In other words, when the sensor package 420 is inserted into the carrier 402, the retention clips 410 may be displaced momentarily and may snap back to their original position when the retention clips 410 align with the notches 422. The notches 422 may be positioned so that the carrier 402 may retain the sensor package 420 while allowing full access to the sensing face 426 of the sensor package 420 via the opening 404. The simplicity of the connection between the carrier 402 and the sensor package 420 may also reduce errors in assembly.

Figure 6:
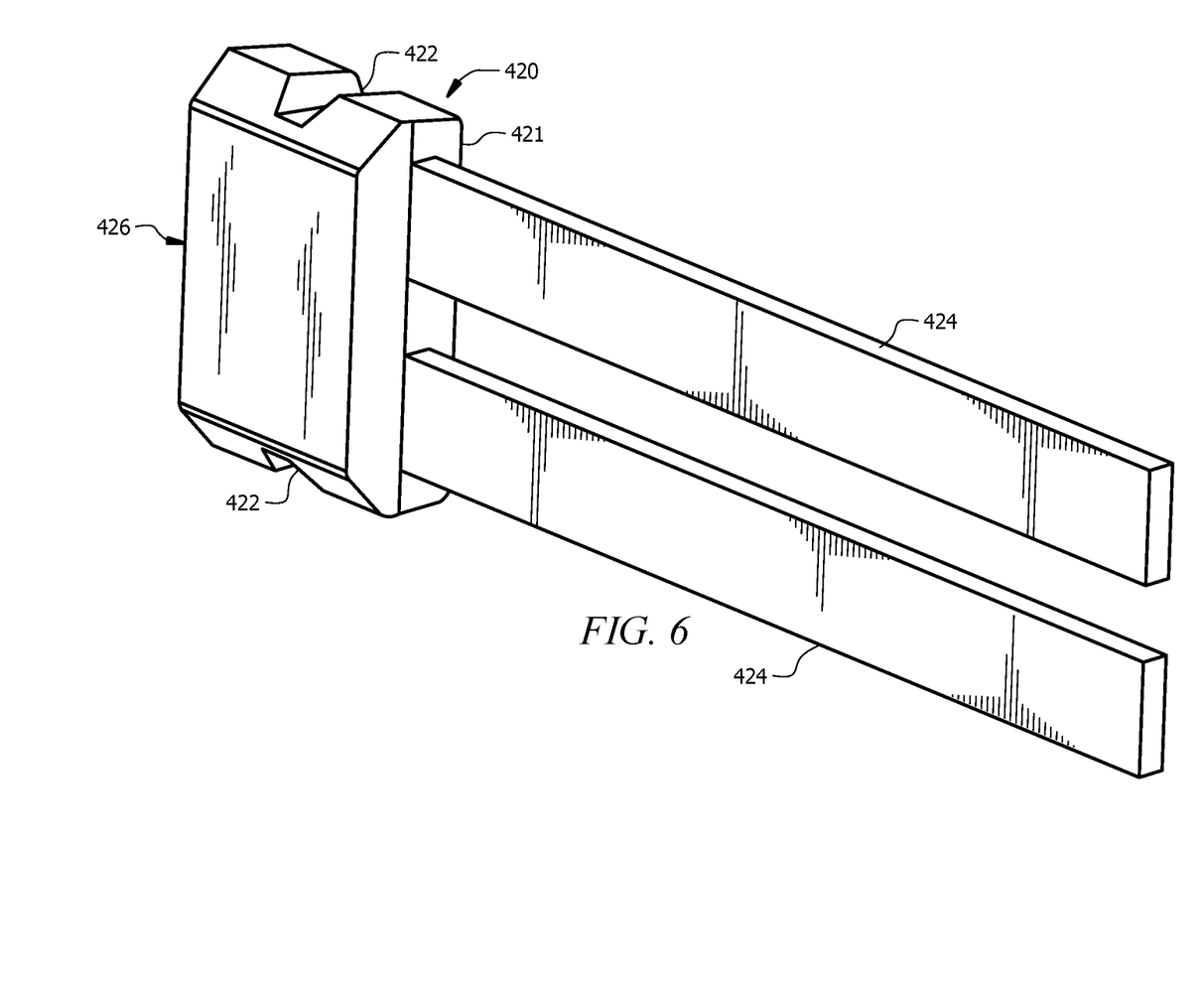
FIG. 6 illustrates a detailed view of the sensor package.

FIG. 6 illustrates a detailed view of the sensor package 420 comprising the housing 421 and leads 424 extending from the housing 421. FIG. 6 also shows the sensing face 426 of the housing 421 and notches 422 formed in the housing 421.

Having described various devices and methods herein, exemplary embodiments or aspects can include, but are not limited to:

In a first embodiment, a sensor package assembly may comprise a sensor package comprising at least one sensor element located within a sensing face of the sensor package; and a carrier comprising retention features configured to retain the sensor package while completely exposing the sensing face of the sensor package.

A second embodiment can include the sensor package assembly of the first embodiment, wherein the carrier is further configured to at least partially expose one or more leads of the sensor package.

A third embodiment can include the sensor package assembly of the first or second embodiments, wherein the sensor package further comprises a housing configured to contain the at least one sensor element and other integrated circuit elements.

A fourth embodiment can include the sensor package assembly of the third embodiment, wherein the housing comprises notches configured to interface with the retention features of the carrier.

A fifth embodiment can include the sensor package assembly of the fourth embodiment, wherein the retention features comprise flexible arms configured to snap into notches, and wherein the material of the carrier comprises a flexible material.

A sixth embodiment can include the sensor package assembly of the third embodiment, wherein the housing comprises at least one angled surface, and wherein the carrier comprises at least one angled surface configured to fit against the at least one angled surface of the housing.

A seventh embodiment can include the sensor package assembly of any of the first to sixth embodiments, wherein the sensor element comprises an anisotropic magneto resistance (AMR) sensor.

An eighth embodiment can include the sensor package assembly of any of the first to seventh embodiments, wherein the sensor element is configured to detect the movement of a magnet ring.

A ninth embodiment can include the sensor package assembly of any of the first to eighth embodiments, wherein the sensor package comprises a plurality of sensor elements, and wherein the plurality of sensor elements are located at or near the sensing face.

In a tenth embodiment, a method for retaining a sensor package within a carrier may comprise inserting a sensor package into a carrier, wherein inserting the sensor package displaces one or more retaining clips of the carrier; retaining the sensor package within the carrier via the retaining clips interfacing with one or more notches of the sensor package; and exposing a sensing face of the sensor package via an opening in the carrier, wherein the sensor package comprises one or more sensor elements located in the sensing face of the sensor package.

An eleventh embodiment can include the method of the tenth embodiment, further comprising sensing, via the one or more sensor elements, movement of a magnet ring.

A twelfth embodiment can include the method of the eleventh embodiment, further comprising determining a speed of an object associated with the magnet ring based on the sensed movement of the ring.

A thirteenth embodiment can include the method of any of the tenth to twelfth embodiments, wherein inserting the sensor package into the carrier comprises aligning one or more angled surfaces of the sensor package with one or more angled surfaces of the carrier.

A fourteenth embodiment can include the method of any of the tenth to thirteenth embodiments, further comprising at least partially exposing one or more leads extending from a housing of the sensor package.

A fifteenth embodiment can include the method of the any of the tenth to fourteenth embodiments, wherein the sensor package comprises an anisotropic magnetoresistance (AMR) sensor.

In a sixteenth embodiment, a carrier configured to retain a sensor package may comprise a plurality of walls forming a first opening configured expose a sensing face of the sensor package, wherein the sensor package comprise at least one sensor element located near the sensing face; and one or more retaining clips configured to interface with a housing of the sensor package.

A seventeenth embodiment can include the carrier of the fifteenth embodiment, further comprising one or more retaining walls shaped and configured to interface with the housing of the sensor package.

An eighteenth embodiment can include the carrier of the sixteenth or seventeenth embodiments, further comprising a plurality of walls forming a second opening configured to at least partially expose one or more leads extended from the housing of the sensor package.

A nineteenth embodiment can include the carrier of any of the sixteenth to eighteenth embodiments, wherein the retaining clips are configured to snap into coordinating notches in the housing of the sensor package.

A twentieth embodiment can include the carrier of any of the sixteenth to nineteenth embodiments, wherein the housing of the sensor package comprises at least one angled surface, and wherein the carrier further comprises at least one angled surface configured to fit against the at least one angled surface of the housing.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A sensor package assembly comprising:
   a sensor package comprising at least one sensor element for sensing a property of an object that is external to a sensing face of the sensor package, the sensor package comprising a housing that is configured to house the at least one sensor element as wells as at least one other integrated circuit element;
   a carrier comprising one or more retention features that are configured to retain the sensor package relative to the carrier while completely exposing the sensing face of the sensor package, wherein the one or more retention features comprise one or more flexible arms; and
   wherein the housing comprises one or more notches, wherein each of the one or more flexible arms of the carrier are configured to snap into a corresponding one of the one or more notches to help retain the housing of the sensor package relative to the carrier.

2. The sensor package assembly of claim 1, wherein the carrier is further configured to at least partially expose one or more leads of the sensor package.

3. The sensor package assembly of claim 1, wherein the one or more flexible arms comprises a flexible material.

4. The sensor package of claim 1 wherein the housing comprises at least one angled surface, and wherein the carrier comprises at least one angled surface configured to fit against the at least one angled surface of the housing.

5. The sensor package assembly of claim 1, wherein the sensor element comprises an anisotropic magneto resistance (AMR) sensor.

6. The sensor package assembly of claim 1, wherein the object that is external to the sensing face comprises a magnet ring, and wherein the sensor element is configured to detect movement of the magnet ring.

7. The sensor package assembly of claim 1, wherein the sensor package comprises a plurality of sensor elements, and wherein the plurality of sensor elements are located at or near the sensing face.

8. A method for retaining a sensor package within a carrier, the method comprising:
   inserting a sensor package into a carrier, wherein inserting the sensor package displaces one or more retaining clips of the carrier;
   retaining the sensor package within the carrier via the retaining clips interfacing with one or more notches of the sensor package, wherein the retaining clips comprise flexible arms configured to snap into the one or more notches of the sensor package; and
   exposing a sensing face of the sensor package via an opening in the carrier, wherein the sensor package comprises one or more sensor elements adjacent the sensing face of the sensor package for sensing a property of an object that is external to the sensing face of the sensor package.

9. The method of claim 8, further comprising sensing, via the one or more sensor elements, movement of a magnet ring.

10. The method of claim 9, further comprising determining a speed of an object associated with the magnet ring based on the sensed movement of the ring.

11. The method of claim 8, wherein inserting the sensor package into the carrier comprises aligning one or more angled surfaces of the sensor package with one or more angled surfaces of the carrier.

12. The method of claim 8, further comprising at least partially exposing one or more leads extending from a housing of the sensor package.

13. The method of claim 8, wherein the sensor package comprises an anisotropic magneto resistance (AMR) sensor.

14. A carrier configured to retain a sensor package, wherein the sensor package includes at least one sensor element located near a sensing face of the sensor package for sensing a property of an object that is external to the sensing face of the sensor package, the sensor package including one or more notches, the carrier comprising:
   a plurality of walls forming a first opening configured expose the sensing face of the sensor package; and
   one or more retaining clips configured to snap into corresponding notches in the housing of the sensor package to help retain the sensor package to the carrier.

15. The carrier of claim 14, further comprising one or more retaining walls shaped and configured to interface with the housing of the sensor package.

16. The carrier of claim 14, further comprising a plurality of walls forming a second opening configured to at least partially expose one or more leads extended from the housing of the sensor package.

17. The carrier of claim 14, wherein the housing of the sensor package comprises at least one angled surface, and wherein the carrier further comprises at least one angled surface configured to fit against the at least one angled surface of the housing.

\* \* \* \* \*